(12) United States Patent
Sasaki et al.

(10) Patent No.: US 6,342,333 B1
(45) Date of Patent: Jan. 29, 2002

(54) PHOTOSENSITIVE RESIN COMPOSITION, PATTERNING METHOD, AND ELECTRONIC COMPONENTS

(75) Inventors: Akihiro Sasaki; Noriyoshi Arai; Makoto Kaji, all of Hitachi; Toshiki Hagiwara, Sagamihara, all of (JP); Brian C. Auman, Newark, DE (US)

(73) Assignees: Hitachi Chemical DuPont Microsystems, L.L.C., Wilmington, DE (US); Hitachi Chemical DuPont Microsystems, Ltd., Tokyo (JP)

( * ) Notice: Subject to any disclaimer, the term of this patent is extended or adjusted under 35 U.S.C. 154(b) by 0 days.

(21) Appl. No.: 09/401,196

(22) Filed: Sep. 23, 1999

(51) Int. Cl.[7] .......................... G03C 1/52; G03C 1/695; G03F 7/004; G03F 7/037; G08J 3/28
(52) U.S. Cl. .............................. 430/270.1; 430/286.1; 430/311; 430/319; 522/14; 522/15; 522/25; 522/31; 522/32; 522/65; 522/142; 522/164; 522/176
(58) Field of Search .................... 522/164, 142, 522/14, 15, 25, 31, 32, 65, 176; 430/270.1, 311, 319, 286.1; 528/220, 229, 288, 322, 335

(56) References Cited

U.S. PATENT DOCUMENTS

| 4,778,859 A | 10/1988 | Hideo et al. |
| 5,097,000 A | * 3/1992 | Trofimenko |
| 5,324,810 A | 6/1994 | Auman |
| 5,478,918 A | * 12/1995 | Maruta et al. |

FOREIGN PATENT DOCUMENTS

| EP | 0 355 927 A | 2/1990 |
| EP | 0 702 270 A | 3/1996 |
| EP | 0 738 745 A1 * | 10/1996 |
| JP | 49-17374 | 4/1979 |
| JP | 54-109828 | 8/1979 |
| JP | 56-24343 | 3/1981 |
| JP | 60-100143 | 6/1985 |
| JP | 8-337652 | 12/1996 |

OTHER PUBLICATIONS

Macromolecules, vol. 27, No. 5, 1994, pp. 1136–1146, "Polyimides Based on 9,9–Disubstituted Xanthane Dianhydrides", S. Trofimenko and B. C. Auman.

* cited by examiner

Primary Examiner—Susan W. Berman
(74) Attorney, Agent, or Firm—Griffin & Szipl, P.C.

(57) ABSTRACT

A photosensitive resin composition comprising an aromatic polyimide precursor, wherein a 10 μm thick layer of precursor has light transmittance at a wavelength of 365 nm of at least 1% and a 10 μm thick polyimide film made from the resin composition by imidation ring closure and deposited on a silicon substrate results in a residual stress of at most 25 MPa. The composition can be patterned through i-line exposure followed by development with alkaline solutions, and can be imidized into low-stress polyimide patterns. Electronic components having the polyimide patterns have high reliability.

22 Claims, 2 Drawing Sheets

POSITIVE TYPE

NEGATIVE TYPE

PHOTOSENSITIVE RESIN COMPOSITION, PATTERNING METHOD, AND ELECTRONIC COMPONENTS

BACKGROUND OF THE INVENTION

1. Field of the Invention

The present invention relates to a photosensitive resin composition, to a method of using the composition for patterning, and to electronic components made using the photosensitive resin composition.

2. Description of the Related Art

Recently, in the semiconductor industry, organic substances with good heat resistance such as polyimide resins and the like have been used as interlayer insulating materials, because of their good characteristics, in place of conventional inorganic materials. Circuit patterning of semiconductor integrated circuits and printed circuits requires many complicated steps of, for example, forming a resist film on the surface of a substrate, removing the unnecessary part of the film through selective exposure and etching at predetermined sites, and rinsing the surface of the thus-processed substrate. It is therefore desired to develop heat-resistant photosensitive materials for use as photoresists that can be directly used as insulating layers after having been patterned through exposure and development.

Heat-resistant photosensitive materials have been proposed, for example, comprising, as a base polymer, photosensitive polyimide, cyclic polybutadiene or the like. Above all, photosensitive polyimides are specifically noted, because their heat resistance is good and impurities (e.g., water, solvents, photosensitive groups of the polymer, photoinitiators, sensitizers, etc.) can be removed. Among such photosensitive polyimides, there has been proposed a system comprising a polyimide precursor and a bichromate (see JP-B 49-17374). The proposed system had the advantages of useful light sensitivity and good film forming ability, but is defective in that its storage stability is poor and that chromium ions remain in the polyimide. With such drawbacks, this system could not be put to practical use.

To solve these problems, a method of mixing a polyimide precursor with a compound having a photosensitive group (see JP-A 54-109828, etc.), and a method of combining a polyimide precursor with a compound having a photosensitive group, thereby introducing the photosensitive group into the polyimide precursor (see JP-A 56-24343, 60-100143, etc.) have been proposed. However, since the photosensitive polyimide precursors in those methods are mainly derived from aromatic monomers having good heat resistance and good mechanical properties, but low UV transmission owing to the light absorption of the polyimide precursors themselves, the result is that the photochemical reaction in the exposed area of the polyimide film is often insufficient (i.e., there is low photosensitivity). As a result, using the above photosensitive polyimide precursors in patterning is often problematic in that the photosensitivity of the polyimide film is low and that the profile and resolution of the patterns formed is not good. With the increase in the degree of semiconductor integration in the art, the design rule in semiconductor devices has become much finer, and semiconductor devices are required to have a higher degree of resolution.

In fabricating semiconductor devices, 1:1 projectors, called mirror projectors, and reduction projectors, called steppers, are being employed, for example, in place of conventional contact/proximity projectors with parallel rays in order to image these finer circuit patterns. For steppers, one can use monochromatic light such as high-power oscillation light from ultra-high-pressure mercury lamps, or excimer laser beams. So-called g-line steppers are the most popular steppers. These steppers use a g-line visible light (having a wavelength of 436 nm) from ultra-high-pressure mercury lamps. However, in order to meet recent requirements of finer working rules, the wavelength of the light to be applied to steppers must be shortened. In this situation, i-line steppers (wavelength: 365 nm) are being used in place of g-line steppers (wavelength: 436 nm).

However, conventional photosensitive polyimide base polymers that are designed for contact/proximity projectors, mirror projectors and g-line steppers have poor i-line transparency, as mentioned above, and the i-line transmittance through the polymers is nearly 0. Therefore, patterning conventional photosensitive polyimides with i-line steppers gives poor patterns. For LOC (lead-on-chip) high-density packaging systems for fabricating semiconductor devices, thick polyimide films are desired for surface protection. The problem of poor light transmittance is even more serious in the case of thick polyimide films. Accordingly, photosensitive polyimides having high i-line transparency and capable of being patterned with i-line steppers into good patterns are highly desired. In this connection, it has been reported that introducing some substituents into the aromatic rings in the main chain of photosensitive polyimides is effective for increasing the i-line transmittance of the polyimides (see JP-A 8-337652, etc.).

The diameter of the silicon wafers used as a substrate for semiconductor devices is becoming larger. The increase in the diameter has brought about another problem in that the silicon wafers coated with a surface-protecting polyimide film are warped more than previously owing to the difference in the thermal expansion coefficient between the polyimide film and the underlying silicon wafer. In this situation, photosensitive polyimides are sought after which have thermal expansion coefficients smaller than that of conventional polyimides. In general, the thermal expansion of polyimides having a rigid rod-like molecular structure is advantageously low. However, the i-line transparency of typical polyimides having a rigid, rod-like molecular structure is low. Therefore, the ability to photopattern polyimides of this type is usually low.

SUMMARY OF THE INVENTION

In accordance with the above objects, the invention provides aromatic polyimide precursors having an increased i-line transparency which are capable of being imidized into polyimide resins with low coefficient of thermal expansion and low mechanical stress on silicon wafers, and provides a photosensitive resin composition comprising the precursor. The composition also has the advantages of good heat resistance, high photosensitivity and high resolution.

The invention also provides a photosensitive resin composition capable of being developed with an aqueous alkaline solution which is more environmentally friendly than solvent based developers.

The invention also provides a patterning method to give polyimide patterns having a good profile. The method uses the photosensitive resin composition noted above. Because of high i-line transmittance and high photosensitivity, the polyimide precursor in the composition is readily processed through i-line exposure to give high-resolution patterns. The polyimide films formed after imidization have the advantages of good heat resistance and low mechanical stress on silicon wafers.

Another advantage of the patterning method according to the invention is that an environmentally friendly aqueous alkaline solution is available for development in the method.

The invention further provides reliable electronic components having high-resolution polyimide patterns. In the electronic components, the polyimide patterns formed have a good profile and high heat resistance, and their residual stress is extremely small.

Specifically, the invention provides in its preferred embodiments the following:

(1) A photosensitive resin composition comprising an aromatic polyimide precursor, in which the light transmittance of a 10 μm thick layer of precursor, at a wavelength of 365 nm, is at least 1%, and a 10 μm thick polyimide film made from the precursor through ring closure, when formed on a silicon wafer, results in a residual stress of no more than 25 MPa.

(2) The photosensitive resin composition of (1), wherein the light transmittance at a wavelength of 365 nm through the 10 μm thick film made from the aromatic polyimide precursor is at least 10%.

(3) A photosensitive resin composition comprising an aromatic polyimide precursor, in which the aromatic polyimide precursor has repetitive, structural units of a general formula (I):

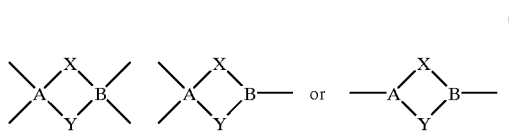

wherein A and B each independently represent a trivalent or tetravalent aromatic group; and X and Y each independently represent an at least divalent group not conjugating with A or B.

(4) The photosensitive resin composition of (3), wherein the aromatic polyimide precursor having the structure of formula (I) has repetitive, structural units of a general formula (II):

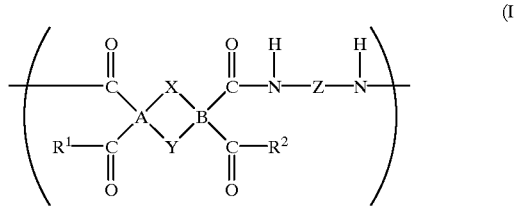

where A and B each independently represent a tetravalent aromatic group; X and Y each independently represent a divalent group not conjugating with A or B; Z represents an at least divalent aromatic group; $R^1$ and $R^2$ each independently represent a hydroxyl group or a monovalent organic group.

(5) The photosensitive resin composition of (1) or (2), wherein the aromatic polyimide precursor is that of (3) or (4).

(6) The photosensitive resin composition of (4), wherein $R^1$ or $R^2$ in formula (II) is a monovalent organic group having a photosensitive group.

(7) The photosensitive resin composition of (4), wherein $R^1$ or $R^2$ in formula (II) is a group of:
—O—N$^+$HR$^4$R$^5$—R$^6$,
—O—R$^6$, or
—NH—R$^6$
where $R^4$ and $R^5$ each independently represent a hydrocarbon group, and $R^6$ represents a monovalent organic group.

(8) The photosensitive resin composition of (7), wherein $R^6$ is a group having a carbon-carbon unsaturated double bond.

(9) The photosensitive resin composition of (7), wherein $R^1$ or $R^2$ in formula (II) is a group of:
—O—N$^+$HR$^4$R$^5$—R$^6$
where $R^4$ and $R^5$ each independently represent a hydrocarbon group, and $R^6$ represents a monovalent organic group having a carbon-carbon unsaturated double bond.

(10) The photosensitive resin composition of (7), wherein $R^1$ or $R^2$ in formula (II) is a group of:
—O—R$^6$
where $R^6$ represents a monovalent organic group.

(11) The photosensitive resin composition of any of (1) to (11), wherein the aromatic polyimide precursor is soluble in an aqueous alkaline solution.

(12) The photosensitive resin composition of (10), wherein Z in formula (II) is a group having a carboxyl group or a phenolic hydroxyl group.

(13) The photosensitive resin composition of (10), wherein Z in formula (II) is a group of a general formula (III):

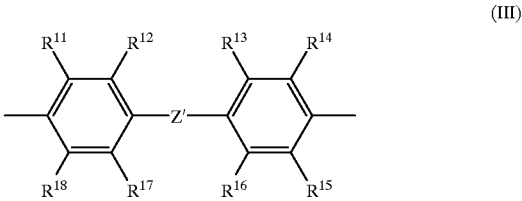

where Z' represents a single bond, O, CH$_2$, S or SO$_2$; $R^{11}$ to $R^{18}$ each independently represent H, COOH, OH, an alkyl group having from 1 to 10 carbon atoms, a fluoroalkyl group having from 1 to 10 carbon atoms, a fluoroalkoxy group having from 1 to 10 carbon atoms, or a halogen atom, and wherein, optionally, at least one of $R^{11}$ through $R^{18}$ is COOH or OH.

(14) The photosensitive resin composition of any one of (3) to (13), wherein X and Y each independently represent a carbonyl group, an oxy group, a thio group, a sulfinyl group, a sulfonyl group, an optionally-substituted alkylene group having from 1 to 5 carbon atoms, an optionally-substituted imino group, an optionally-substituted silylene group, or a combination of any of these groups.

(15) The photosensitive resin composition of (14), wherein X and Y each independently represent an oxy group, a thio group, a sulfonyl group, an optionally-substituted methylene group, or an optionally-substituted silylene group.

(16) The photosensitive resin composition of (15) wherein X is an optionally-substituted methylene group, and Y is an oxy group.

(17) The photosensitive resin composition of any one of (3) to (16), wherein A and B are both benzene rings.

(18) The photosensitive resin composition of any one of (1) to (17), which further contains a photopolymerization initiator and which has a negative-type photosensitive characteristic.

(19) The photosensitive resin composition of any one of (1) to (17), which further contains a compound capable of generating an acid in light and which has a positive-type photosensitive characteristic.

(20) A method for forming patterns, which comprises applying the photosensitive resin composition of any one of (1) to (19) onto a substrate and drying, exposing the composition, developing the composition, and heating the composition to form a pattern layer.

(21) The patterning method of (20), wherein I-line radiation is used as the light source in the exposing step.

(22) The patterning method of (20) or (21), wherein the substrate is a silicon wafer having a diameter of at least 12 inches.

(23) Electronic components having a patterned layer according to the method of any one of (20) to (22).

(24) Electronic components of (23) for semiconductor devices, wherein the patterned layer is for a surface-protecting film or an interlayer insulating film.

Further objects, features and advantages of the present invention will become apparent from the Detailed Description of preferred embodiments, which follows, when considered together with the attached drawings.

DETAILED DESCRIPTION OF THE INVENTION

Figure 2A:
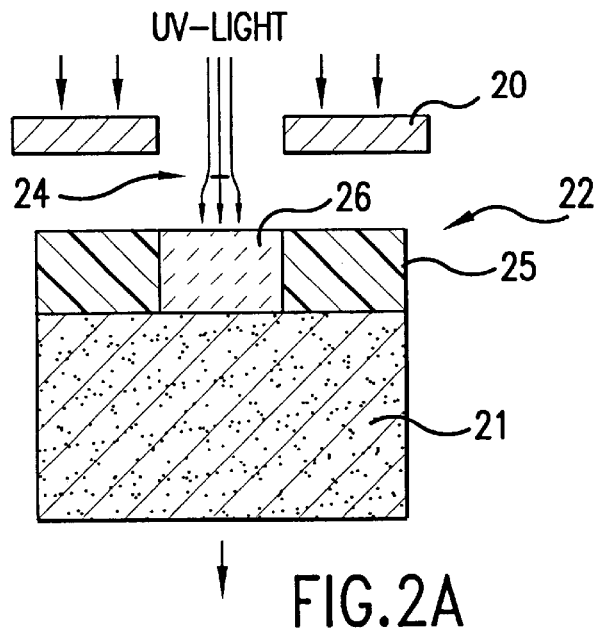
FIGS. 2A to 2C generally illustrate the use of negative and positive type photosensitive resin compositions.
Figure 2B:
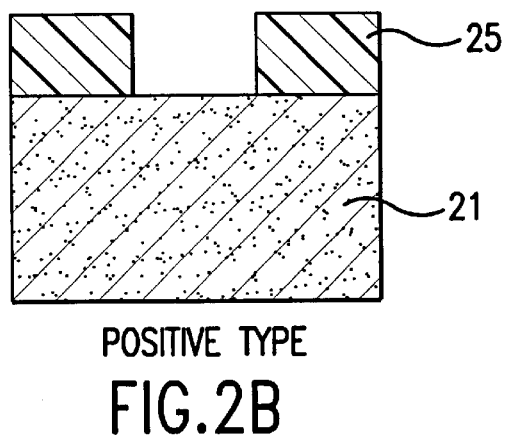
Figure 2C:
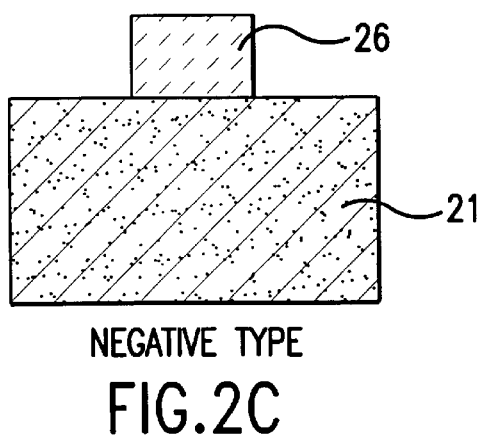

The function of negative and positive type photosensitive resin compositions is illustrated in FIGS. 2A to 2C. FIG. 2a shows UV-light 24 being projected through a mask 20 onto a photosensitive resin composition layer 22. The light 24 exposes portion 26, and leaves portion 25 unexposed. In the negative type photosensitive resin compositions, the exposed portion is cross-linked or polymerized followed by curing, and the unexposed portion 25 is removed by developer to reveal a pattern of exposed portions 26, as illustrated in FIG. 2C. In positive type photosensitive resin compositions, the exposed portion 26 is made more soluble by action of light. Thus, it is the exposed portion 26 which is removed by the developer, leaving a pattern of the unexposed portion 25. As discussed below, the photosensitive resin composition of the present invention includes both negative and positive type compositions.

The photosensitive resin composition of the invention comprises an aromatic polyimide precursor. The aromatic polyimide precursor contains repetitive units having an aromatic ring, at least partly therein. Specifically, the precursor includes aromatic polyamic acids; aromatic polyamic esters as derived from aromatic polyamic acids by partly or entirely esterifying the carboxyl groups of the acids; and aromatic polyamic acid amides as derived from aromatic polyamic acids by partly or entirely amidating the carboxyl groups of the acids.

The aromatic polyimide precursor for use in the invention is preferably one in which the light transmission at a wavelength of 365 nm through a film made from the precursor and having a thickness of 10 μm is at least 1%, more preferably at least 5%, even more preferably at least 10%. If the light transmittance is smaller than 1%, photosensitive resin compositions capable of being patterned into high-resolution patterns having a good profile are difficult to obtain. Especially preferably, the light transmittance falls between 10% and 80%. The polyimide precursor film can be formed by applying a solution of the polyimide precursor in a solvent onto a substrate followed by drying. The light transmittance at a wavelength of 365 nm through the polyimide film can be measured with a spectrophotometer (for example, Hitachi U-3410 Model from Hitachi Ltd.).

Also preferably, the aromatic polyimide precursor of the invention forms a polyimide film through imidating ring closure and when deposited on a silicon wafer, has a residual stress of no more than 25 MPa. If the residual stress is larger than 25 MPa, the polyimide films formed from the precursor-containing composition of the invention are defective in that, when they are formed on silicon wafers or when they are used in silicon chips, the silicon wafers warp and the residual stress inside the silicon chips is large. More preferably, the residual stress according to the present invention falls between 0 and 20 MPa. The residual stress of the polyimide film is measured at room temperature (25° C.), for example, with a thin film stress meter (e.g., Tencor's FLX-2320 Model).

According to the present invention, it is desirable that the aromatic polyimide precursor in the photosensitive resin composition of the invention have a structural unit (ladder structure) of the above formula (I) in the repetitive units. As a rule, the polyimide precursor having the structure above satisfies the above requirements for light transmittance of a film at a wavelength of 365 nm and for the residual stress of the resulting polyimide film.

The repetitive units constituting the aromatic polyimide precursor are generally meant to indicate the units comprising the carboxylic acid residue derived from the tetracarboxylic acid dianhydride or the like used as one starting compound for the precursor and the amine residue derived from the diamine also used as the other starting compound. In the above reaction scheme, the structural unit of formula (I) may be the carboxylic acid residue or may be a part of the dicarboxylic acid residue, or may be the diamine residue or may be a part of the diamine residue.

Above all, preferred are aromatic polyimide precursors having the structural units of formula (I), or more preferably, those having repetitive units of formula (II), since the precursors have a highly rod-like structure after imidization, and since the residual stress of the polyimides obtained from them is low.

In formulae (I) and (II), A and B each independently represent a trivalent or tetravalent aromatic group (in formula (II), however, they are tetravalent aromatic groups). The aromatic group referred to herein is a group having an aromatic ring such as a benzene ring, a naphthalene ring, an anthracene ring, a pyridine ring, a furan ring, a quinoline ring, or the like. Two or more aromatic rings may be bonded to each other via any bonding to give the aromatic group. Preferably, however, the aromatic group has one aromatic ring. The aromatic rings for the group may be substituted ones. It is desirable that two groups of X and Y bond to A and B at the ortho- or "para"-position of the aromatic rings of A and B, for example, as in the following formulae:

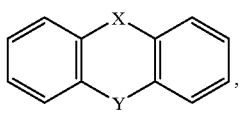

-continued

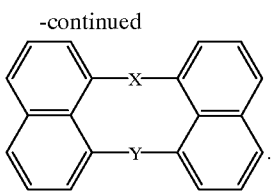

It is desirable that, in the polyimide precursors having repetitive units of formula (II), two carbonyl groups bond to A and B in the repetitive units at the ortho- or "para"-position of the aromatic rings of A and B.

Examples of A and B in formulae (I) and (II) are mentioned below. The trivalent groups (referred to as "triyl" groups) for A and B include tricyclic aromatic groups such as an anthracene-2,3,6-triyl group, a fluorene-2,3,6-triyl group, etc.; bicyclic aromatic groups such as a naphthalene-2,3,6-triyl group, a naphthalene-1,4,5-triyl group, a quinoline-2,3,6-triyl group, etc.; monocyclic aromatic groups such as a benzene-1,2,4-triyl group, a pyridine-2,3,5-triyl group, a furan-2,3,4-triyl group, etc., all of which may have substituents. The tetravalent groups (referred to herein as "tetrayl" groups)include tricyclic aromatic groups such as an anthracene-2,3,6,7-tetrayl group, a fluorene-2,3,6,7-tetrayl group, etc.; a bicyclic aromatic groups such as a naphthalene-2,3,6,7-tetrayl group, a naphthalene-1,4,5,8-tetrayl group, a quinoline-2,3,6,7-tetrayl group, etc.; monocyclic aromatic groups such as a benzene-1,2,4,5-tetrayl group, a pyridine-2,3,5,6-tetrayl group, a furan-2,3,4,5-tetrayl group, etc., all of which, optionally, may have substituents. Of those, preferred are monocyclic aromatic groups optionally having substituents; more referred are optionally-substituted benzenetetrayl groups; even more preferred are optionally-substituted benzene-1,2,4,5-tetrayl groups.

X and Y each independently represent an at least divalent group not conjugating with A or B. Specifically, the divalent group includes a carbonyl group, an oxy group, a thio group, a sulfinyl group (i.e., a divalent group having a sulfoxide), a sulfonyl group (i.e., a divalent group having a sulfone), an optionally-substituted alkylene group having from 1 to 5 carbon atoms, an optionally-substituted imino group, an optionally-substituted silylene group, and a combination of any of these groups. Of those groups, preferred are an oxy group, a thio group, a sulfonyl group, an optionally-substituted methylene group, and an optionally-substituted silylene group, as the i-line transmittance and the heat resistance of the polyimide precursors comprising any of the above groups are good.

The substituents which the groups of A, B, X and Y may have include monovalent substituents and divalent substituents. Specifically, the substituents include an optionally-branched alkyl group having from 1 to 10 carbon atoms; a halogen-substituted optionally branched alkyl group having from 1 to 10 carbon atoms (in which the halogen includes chlorine, fluorine, iodine and bromine); an alkenyl group having from 1 to 10 carbon atoms; an alkynyl group having from 1 to 10 carbon atoms; an aromatic hydrocarbon group having from 6 to 20 carbon atoms, such as a phenyl group, a benzyl group, etc.; an alkyloxy group having from 1 to 10 carbon atoms; a halogen-substituted alkyloxy group having from 1 to 10 carbon atoms (in which the halogen includes chlorine, fluorine, iodine and bromine); a cyano group; a halogen atom (e.g., chlorine, fluorine, iodine, bromine); a hydroxyl group; an amino group; an azido group; a mercapto group; a trialkylsilyl group in which each alkyl group has from 1 to 5 carbon atoms; an alkylene group having from 2 to 5 carbon atoms; a carbonyl group; a carboxyl group; an imino group; an oxy group; a thio group; a sulfinyl group; a sulfonyl group; a dialkylsilylene group in which each alkyl group has from 1 to 5 carbon atoms; and combinations of the above. Preferred substituents are an alkyl group having from 1 to 5 carbon atoms, a halogen-substituted alkyl group having from 1 to 5 carbon atoms, an alkyloxy group having from 1 to 5 carbon atoms, a halogen-substituted alkyloxy group having from 1 to 5 carbon atoms, an aromatic hydrocarbon group, and an alkylene group having 2 or 3 carbon atoms.

Preferred examples of the structural units comprising A, B, X and Y are mentioned below.

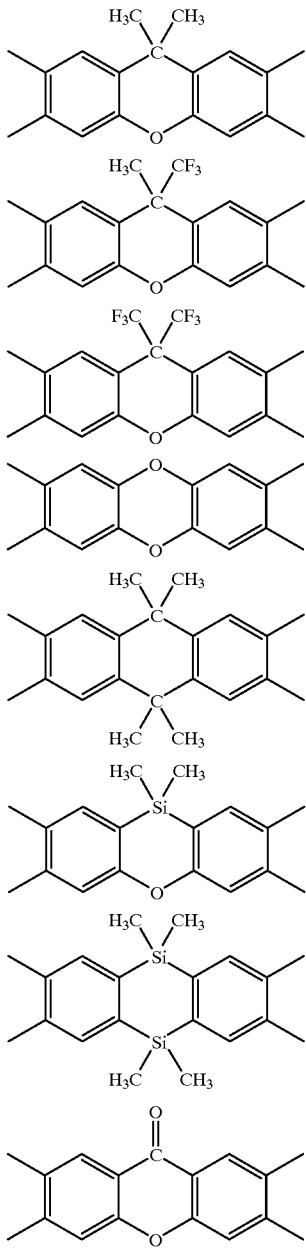

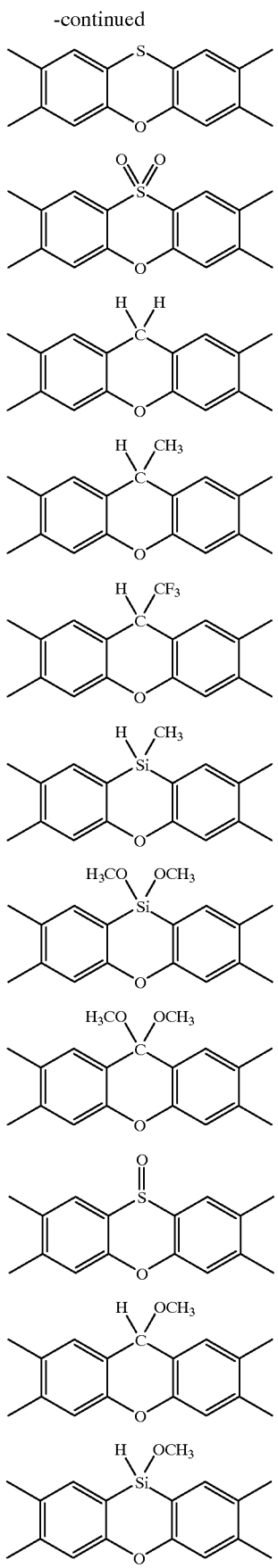

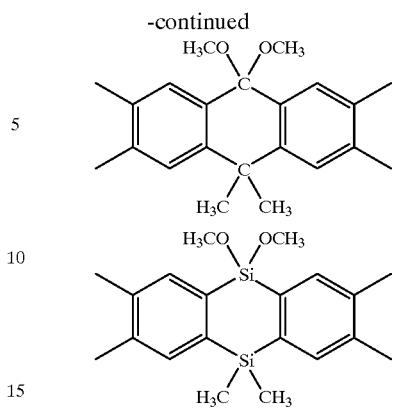

In formula (II), the group of Z is an optionally-substituted divalent aromatic group. In general, this is a residue of the starting diamine, as derived from the diamine by removing the two amino groups from it. Specific examples of this group include a p-phenylene group, a m-phenylene group, a 4,4'-biphenylene group, a 4,4'-terphenylene group, a 4,4'-oxydiphenylene group, a 4,4'-methylenediphenylene group, a 4,4'-thiodiphenylene group, a 4,4'-sulfonyldiphenylene group, and a 4,4'-carbonyldiphenylene group, all of which may have substituents. Preferred groups are optionally-substituted p-phenylene groups, 4,4'-biphenylene groups and 4,4'-terphenylene groups, as the residual stress of the polyimides from the precursors comprising any of the above is small. The substituents which the groups noted above may have include those mentioned hereinabove with respect to the groups of A, B, X and Y. The preferred substituents are also referred to above.

Preferably, the aromatic polyimide precursor for use in the invention is soluble in an aqueous alkaline solution. The photosensitive resin composition of the invention that comprises such an alkali-soluble precursor could be developed with an aqueous alkaline solution having minimal adverse impact on the environment.

One preferred method for making the aromatic polyimide precursor having structural units of formula (I) soluble in an aqueous alkaline solution is to make the precursor have repetitive units of formula (II) where Z is a carboxyl group or a phenolic hydroxyl group.

From the viewpoint of i-line transmittance of the precursors and of the low stress and heat resistance of the polyimides made from the precursors and for ability to develop in a positive fashion, it is desirable that Z in formula (II) be a group of a general formula (III):

(III)

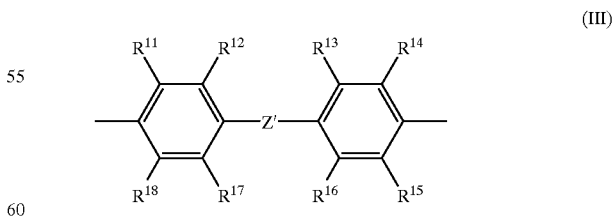

where Z' represents a single bond, O, $CH_2$, S or $SO_2$; $R^{11}$ to $R^{18}$ each independently represent H, COOH, OH, an alkyl group having from 1 to 10 carbon atoms, a fluoroalkyl group having from 1 to 10 carbon atoms, a fluoroalkoxy group having from 1 to 10 carbon atoms, or a halogen atom, and at least one of $R^{11}$ to $R^{18}$ these is COOH or OH.

Preferred examples of the group of formula (III) are as follows:

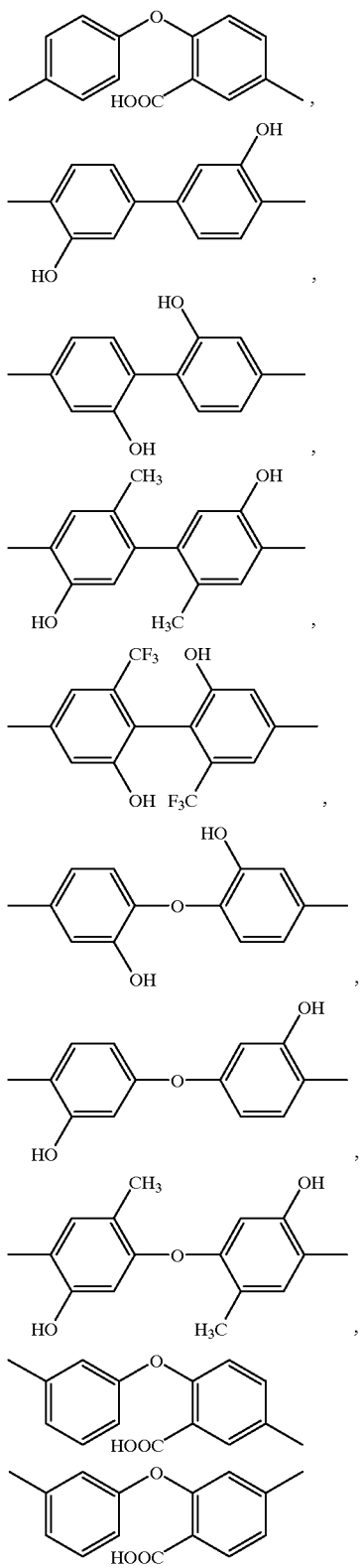

In formula (II), $R^1$ and $R^2$ each independently represent a hydroxyl group or a monovalent organic group. The preferred type and the proportion of $R^1$ and $R^2$ in formula (II) may vary, depending on the intended photosensitive resin composition as to whether the composition is of a positive type or a negative type.

The monovalent organic group for $R^1$ and $R^2$ is, for example, as follows:

—O⁻N⁺HR⁴R⁵—R⁶,

—O—R⁶, or

—NH—R⁶ where $R^4$ and $R^5$ each independently represent a hydrocarbon group, and $R^6$ represents a monovalent organic group.

For the negative-type composition, the group of $R^1$ is preferably a photosensitive group. The photosensitive group may have a carbon-carbon unsaturated double bond. The group having a carbon-carbon unsaturated double bond is, for example, as follows:

—O⁻N⁺HR⁴R⁵—R⁷,

—O—R⁷, or

—NH—R⁷ where $R^4$ and $R^5$ each independently represent a hydrocarbon group, and $R^7$ represents a monovalent organic group having a carbon-carbon unsaturated double bond.

Preferably, $R^4$ and $R^5$ each are a hydrocarbon group having from 1 to 5 carbon atoms. Also preferably, the monovalent organic group having a carbon-carbon unsaturated double bond for $R^7$ is, for example, an acryloxyalkyl or methacryloxyalkyl group in which the alkyl group has from 1 to 10 carbon atoms.

For a negative-type photosensitive resin composition, it is desirable that, at least a part, but, preferably from 20 to 100 mol % of the side chains of carboxylic acid residues in the repetitive units constituting the aromatic polyimide precursor (in formula (II), the groups of $R^1$ and $R^2$) be monovalent organic groups having a carbon-carbon unsaturated double bond.

For a positive-type photosensitive resin composition, preferred are a carboxyl group and a monovalent organic group of —O—R⁶ or —NH—R⁶ (where $R^6$ is a monovalent organic group with no carbon-carbon unsaturated double bond, such as a hydrocarbon group or the like). The hydrocarbon group includes, for example, an alkyl group having from 1 to 10 carbon atoms, a phenyl group, a benzyl group, etc. In the positive-type photosensitive resin composition where the side chains of carboxylic acid residues in the repetitive units constituting the aromatic polyimide precursor (in formula (II), the groups of $R^1$ and $R^2$) are of the monovalent organic group noted above, it is desirable that the diamine residues in the precursor contain alkali-developable groups (e.g., carboxyl group, phenolic hydroxyl group, etc.), for example, those of formula (III).

The aromatic polyimide precursor having repetitive units of structure of formula (I) may further contain any additional repetitive units of polyimide precursors except those with the structure (I) and any repetitive units of polyimides. In that case, the proportion of the repetitive units having the structure of formula (I) to all repetitive units constituting the precursor is not specifically defined, but is preferably so controlled that the 365 nm transmittance of the polyimide precursor itself and the heat resistance and the low thermal expansion of the polyimides derived from the precursor through imidization meet the requirements defined herein. Specifically, it is desirable that the proportion of the repetitive units having the structure of formula (I) to all repetitive units falls between 10 and 100 mol %, more preferably between 50 and 100 mol %.

The molecular weight of the aromatic polyimide precursor for use in the invention is not specifically defined, but the weight-average molecular weight thereof preferably falls between 10,000 and 200,000. The molecular weight is measured through gel permeation chromatography based on a polystyrene standard.

The aromatic polyimide precursor for use in the invention may be prepared from an acid component comprising a tetracarboxylic acid dianhydride of a general formula (IV):

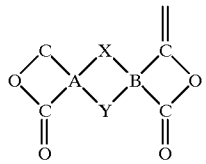

(IV)

wherein A, B, X and Y have the same meanings as in formula (I), or its derivative, and an amine component comprising an aromatic diamine of $H_2N$—Z—$NH_2$ (where Z has the same meaning as in formula (II)), and optionally a compound capable of giving residues of $R^1$ and $R^2$ to the precursor, by reacting them in various methods.

In the precursor for use in the invention, the repetitive units having a structure of formula (I) are indispensable. However, not interfering with the effect of the invention, a tetracarboxylic acid dianhydride or its derivative not having the structure of formula (I) may be combined with the tetracarboxylic acid anhydride of its derivative having the structure of formula (I).

The tetracarboxylic acid dianhydride not having the structure of formula (I) is preferably a dianhydride having a rigid, rod-like structure, such as dianhydride of pyromellitic acid, 3,3',4,4'-biphenyltetracarboxylic acid, and like compounds. Further preferred dianhydrides include, for example, dianhydrides of various aromatic tetracarboxylic acids such as thiodiphthalic acid, oxydiphthalic acid, 3,3',4,4'-benzophenonetetracarboxylic acid, 1,2,5,6-naphthalenetetracarboxylic acid, 2,3,6,7-naphthalenetetracarboxylic acid, 1,4,5,8-naphthalenetetracarboxylic acid, 2,3,5,6-pyridinetetracarboxylic acid, 3,4,9,10-perylenetetracarboxylic acid, sulfonyldiphthalic acid, m-terphenyl-3-3',4,4'-tetracarboxylic acid, p-terphenyl-3,3', 4,4'-tetracarboxylic acid, 1,1,1,3,3,3-hexafluoro-2,2-bis(2,3- or 3,4-dicarboxyphenyl)propane, 2,2-bis(2,3- or 3,4-dicarboxyphenyl)propane, 2,2-bis{4'-(2,3- or 3,4-dicarboxyphenoxy)phenyl}propane, 1,1,1,3,3,3-hexafluoro-2,2-bis{4'-(2,3- or 3,4-dicarboxyphenoxy)phenyl}propane; 1,3-bis(3,4-carboxyphenoxy) benzene, 1,4-bis(3,4-carboxyphenoxy) benzene, 4,4'-bis(3,4-carboxyphenoxy) diphenyl ether, 4-4'-bis(3,4-carboxyphenoxy)biphenyl, as well as other aromatic tetracarboxylic acid anhydrides of general formula (V):

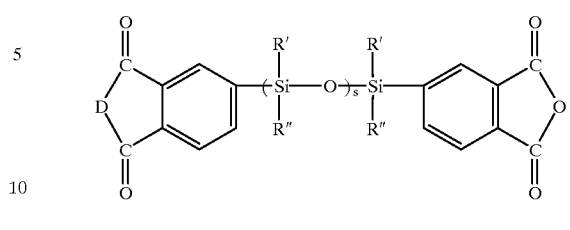

(V)

wherein R' and R" may be the same or different and each independently represents a hydrocarbon group having from 1 to 10 carbon atoms, and s represents 0 or any integer. One or more of these groups may be used either singly or in combination. As derivatives of tetracarboxylic acid dianhydrides, for example, one can include tetracarboxylic acids, tetracarboxylic acid chlorides, etc.

The amount of the tetracarboxylic acid dianhydride of formula (IV) to be used in the reaction is preferably from 10 to 100 mol % of all tetracarboxylic acids to be used therein. If the amount is smaller than 10 mol %, the i-line transmittance through the polyimide precursor produced will lower.

The aromatic diamine is any known diamine, including, for example, p- (or m-)phenylenediamine, 2,4- (or 2,5-, 2,6- or 3,5-)diaminotoluene, 2,5- (or 2,6-)diamino-p-xylene, 2,4- (or 2,5- or 4,6-)diamino-m-xylene, 3,5- (or 3,6-)diamino-o-xylene, 2,4-diaminomesitylene, 3,6-diaminodurene, benzidine, o-tolidine, m-tolidine, 4,4'-diaminoterphenyl, 1,5- (or 2,6-)diaminonaphthalene, 2,7-diaminofluorene, 4,4'- (or 3,4'-, 3,3'-, 2,4'- or 2,2'-)diaminodiphenyl ether, 4,4'- (or 3,4'-, 3,3'-, 2,4'- or 2,2')diaminodiphenylmethane, 4,4'- (or 3,4'-, 3,3'-, 2,4'- or 2,2')diaminodiphenyl sulfone, 4,4'- (or 3,4'-,3,3'-, 2,4'- or 2,2'-)diaminodiphenyl sulfide, 4,4'-benzophenonediamine, 1,1,1,3,3,3-hexafluoro-2,2-bis(4-aminophenyl)propane, 2,2'-bis(trifluoromethyl) benzidine, 2,2'-bis(trifluoromethoxy) benzidine, etc. One or more of these groups may be used either singly or in combination.

Any of the following groups may be introduced into the precursors to make them soluble in an aqueous alkaline solution:

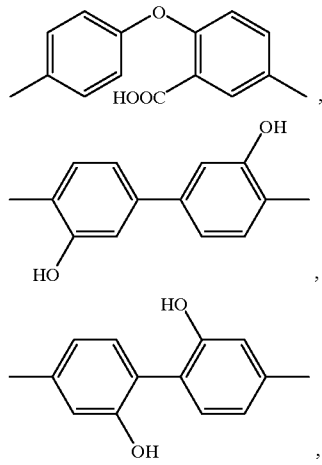

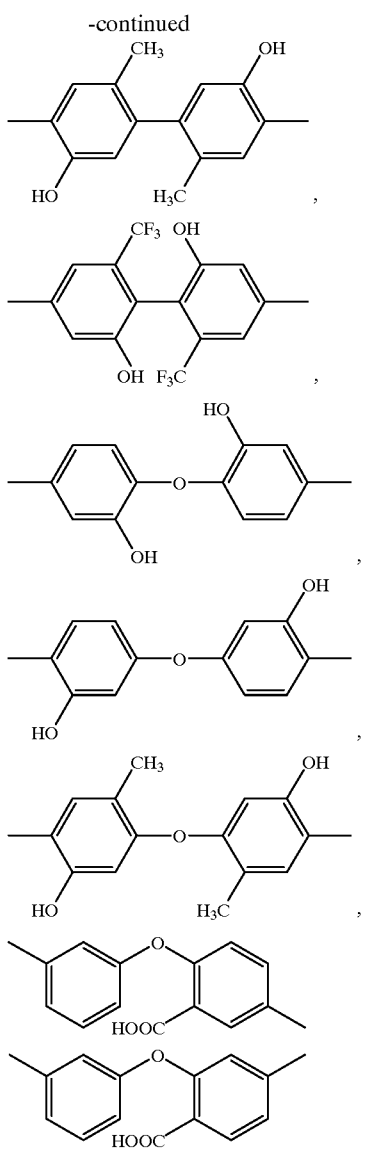

The alkali-soluble, aromatic polyimide precursors comprising any of the diamine residues noted above have the advantages of alkali developability after exposure, safer working conditions for persons handling these materials, and simplified treatment of developer waste.

For producing polyamic acids (of formula (II) where $R^1$ and $R^2$ are both hydroxyl groups) for the polyimide precursor, a tetracarboxylic acid dianhydride may be reacted with a diamine in an organic solvent by ring-opening polyaddition. In this case, the ratio of the tetracarboxylic acid dianhydride to the diamine preferably fall s between 0.7/1 and 1/0.7 by mol.

The reaction may be effected typically in an organic solvent. The organic solvent used is preferably an aprotic polar solvent capable of completely dissolving the polyimide precursor formed, including, for example, N-methyl-2-pyrrolidone, N,N-dimethylacetamide, N,N-dimethylformamide, N,N-dimethyl-2-imidazolidone, dimethylsulfoxide, tetramethylurea, hexamethylphosphoric acid triamide, γ-butyrolactone, etc.

Apart from those aprotic polar solvents, also usable are ketones, esters, lactones, ethers, halogenated hydrocarbons, hydrocarbons, etc. For example, usable are acetone, diethyl ketone, methyl ethyl ketone, methyl isobutyl ketone, cyclohexanone, methyl acetate, ethyl acetate, butyl acetate, diethyl oxalate, diethyl malonate, diethyl carbonate, δ-valerolactone, diethyl ether, ethylene glycol dimethyl ether, diethylene glycol dimethyl ether, tetrahydrofuran, dioxane, chloroform, dichloromethane, 1,2-dichloroethane, 1,4-dichlorobutane, trichloroethane, chlorobenzene, o-dichlorobenzene, hexane, heptane, octane, benzene, toluene, xylene, etc. One or more these organic solvents may be used either singly or in combination.

For producing polyimide precursors of formula (II) where $R^1$ and $R^2$ both have a photosensitive group ionically bonding thereto, the polyamic acid may be mixed with an acrylic compound having an amino group.

The acrylic compound with an amino group to be used in the case of ionically bonding photosensitive groups includes, for example, N,N-dimethylaminoethyl methacrylate, N,N-diethylaminoethyl methacrylate, N,N-dimethylaminopropyl methacrylate, N,N-diethylaminopropyl methacrylate, N,N-dimethylaminoethyl acrylate, N,N-diethylaminoethyl acrylate, N,N-dimethylaminopropyl acrylate, N,N-diethylaminopropyl acrylate, N,N-dimethylaminoacrylamide, N,N-dimethylaminoethylacrylamide, etc. One or more of these groups may be used either singly or in combination.

The amount of the acrylic compound to be used is preferably from 1 to 200 parts by weight, more preferably from 5 to 150 parts by weight, relative to 100 parts by weight of the polyamic acid with which it is mixed. If the amount is smaller than 1 part by weight, the photosensitivity of the polyimide precursor formed will be poor. On the other hand, however, if the amount is larger than 200 parts by weight, the heat resistance and the mechanical properties of the polyimide films formed will be poor.

For producing polyamic esters for the polyimide precursor, a tetracarboxylic acid dianhydride is first reacted with an alcohol compound to give a tetracarboxylic acid diester, then the diester is reacted with thionyl chloride or the like to give a tetracarboxylic acid diester dihalide. Thereafter, the resulting dihalide is, after having been dissolved in an organic solvent, reacted with a diamine in an organic solvent containing a dehydrohalogenating agent such as pyridine or the like, by dropwise adding the former to the solution of the latter in the solvent. Finally, the resulting reaction mixture is poured into a poor solvent such as water or the like, whereby the precipitate formed is removed through filtration and dried.

For polyamic esters with a photosensitive group that are used in negative-type photosensitive resin compositions, the alcohol compound to be used is preferably an unsaturated alcohol compound, including, for example, hydroxymethyl acrylate, hydroxymethyl methacrylate, hydroxyethyl acrylate, hydroxyethyl methacrylate, hydroxypropyl acrylate, hydroxypropyl methacrylate, hydroxybutyl acrylate, hydroxybutyl methacrylate, etc. Especially preferred are hydroxyalkyl acrylates and methacrylates in which the alkyl chain moiety has from 1 to 10 carbon atoms.

On the other hand, for polyamic esters with no photosensitive group that are used in positive-type photosensitive resin compositions, the alcohol compound to be used is preferably a saturated alcohol compound. As the saturated alcohol compound, preferred are alkyl alcohols having from 1 to 10 carbon atoms, including, for example, methanol, ethanol, n-propyl alcohol, isopropyl alcohol, n-butyl alcohol, sec-butyl alcohol, tert-butyl alcohol, isobutyl alcohol, 1-pentanol, 2-pentanol, 3-pentanol, isoamyl alcohol, 1-hexanol, 2-hexanol, 3-hexanol, etc. One or more of these alcohols may be used either singly or in combination.

In producing the tetracarboxylic acid diesters, the ratio of the tetracarboxylic acid anhydride to the alcohol compound preferably falls between 1/2 and 1/2.5 by mol, but is most preferably 1/2 by mol. The ratio of the tetracarboxylic acid dianhydride to the base preferably falls between 1/0.001 and 1/3 by mol, more preferably between 1/0.005 and 1/2 by mol. The reaction temperature preferably falls between 10 and 60° C., and the reaction time preferably falls between 3 and 24 hours.

A known method may be used for the next step of producing the tetracarboxylic acid diester dihalide. For example, thionyl chloride is dropwise added to the solution of the tetracarboxylic acid diester dissolved in an organic solvent, and reacted with the diester. The ratio of the tetracarboxylic acid diester to thionyl chloride preferably falls between 1/1.1 and 1/2.5 per mol, more preferably between 1/1.5 and 1/2.2 per mol. The reaction temperature preferably falls between −20° C. and 40° C., and the reaction time preferably falls between 1 and 10 hours.

In the next step, the tetracarboxylic acid diester dihalide formed previously is dissolved in an organic solvent, and reacted with a diamine in the presence of a dehydrohalogenating agent such as pyridine, or the like. For this reaction, the dihalide solution is dropwise added to a solution of the diamine and the dehydrohalogenating agent in an organic solvent to give a polyamic ester. After the reaction, the reaction mixture is poured into a poor solvent such as water or the like, and the resulting precipitate is obtained through filtration, and dried to obtain the intended polyamic ester. The ratio of the total amount of the diamine used to the tetracarboxylic acid diester dihalide preferably falls between 0.6/1 and 1/0.6 per mol, more preferably between 0.7/1 and 1/0.7 per mol. The reaction temperature preferably falls between −20° C. and 40° C., and the reaction time preferably falls between 1 and 10 hours. The ratio of the dehydrohalogenating agent to the tetracarboxylic acid diester dihalide preferably falls between 1.8./1 and 2.2/1 by mol, more preferably between 1.9/1 and 2.1/1 by mol.

For producing polyamic acid amides for the polyimide precursor, employable is the same process as above for producing the polyamic esters, except that a monoamine compound is used in place of the alcohol compound. The monoamine compound includes, for example, methylamine, ethylamine, n-propylamine, isopropylamine, n-butylamine, sec-butylamine, tert-butylamine, isobutylamine, 1-pentylamine, 2-pentylamine, 3-pentylamine, isoamylamine, 1-hexylamine, 2-hexylamine, 3-hexylamine, morpholine, aniline, benzylamine, as well as various unsaturated amines such as aminoalkyl acrylates, aminoalkyl methacrylates, etc.

The photosensitive resin composition of the invention is characterized by containing any of the polyimide precursors mentioned hereinabove. Various methods are employable to make the composition have photosensitivity.

For example, as in the embodiments mentioned above, a method of introducing a carbon-carbon-unsaturated-double-bond-containing group into the side chains of the polyimide precursor itself may be employed to thereby make the polyimide precursor have a photo-crosslinkable structure, whereby the composition comprising the precursor is made photosensitive. A method may be employed of adding to the composition a compound (e.g., aminoacrylates) having a carbon-carbon unsaturated bond and an amino group and capable of ionically bonding to the polyimide precursor in the composition. A method may also be employed of adding a reactive monomer having one or more carbon-carbon unsaturated double bonds to the composition, thereby making the composition photosensitive. In addition, a method may be employed of adding a photosensitivity-imparting agent such as an optically acid-generating agent, an optically base-generating agent or the like to the composition. These methods are known in the art.

As a rule, the polyimide precursor according to the invention in the negative-type photosensitive resin composition of the invention has a carbon-carbon unsaturated double bond by itself, or if not, a compound having a carbon-carbon unsaturated double bond is added to the composition. Preferably, the composition further contains a photopolymerization initiator along with those constituent components.

The photopolymerization initiator includes, for example, Michler's ketone, benzoin methyl ether, benzoin ethyl ether, benzoin isopropyl ether, 2-t-butylanthraquinone, 2-ethylanthraquinone, 4,4-bis(diethylamino)benzophenone, acetophenone, benzophenone, thioxanthone, 2,2-dimethoxy-2-phenylacetophenone, 1-hydroxycyclohexyl phenyl ketone, 2-methyl-[4-(methylthio)phenyl]-2-morpholino-1-propanone, benzil, diphenyl disulfide, phenanthrenequinone, 2-isopropylthioxanthone, riboflavin tetrabutyrate, 2,6-bis(p-diethylaminobenzal)-4-methyl-4-azacyclohexanone, N-ethyl-N-(p-chlorophenyl)glycine, N-phenyldiethanolamine, 2-(o-ethoxycarbonyl)oximino-1, 3-diphenylpropanedione, 1-phenyl-2-(o-ethoxycarbonyl) oximinopropan-1-one, 3,3,4,4-tetra(t-butylperoxycarbonyl) benzophenone, 3,3-carbonylbis(7-diethylaminocoumarin), bis(cyclopentadienyl)-bis[2,6-difluoro-3-(pyr-1-yl)phenyl] titanium, as well as various azide compounds such as bisazides of the following structural formulae:

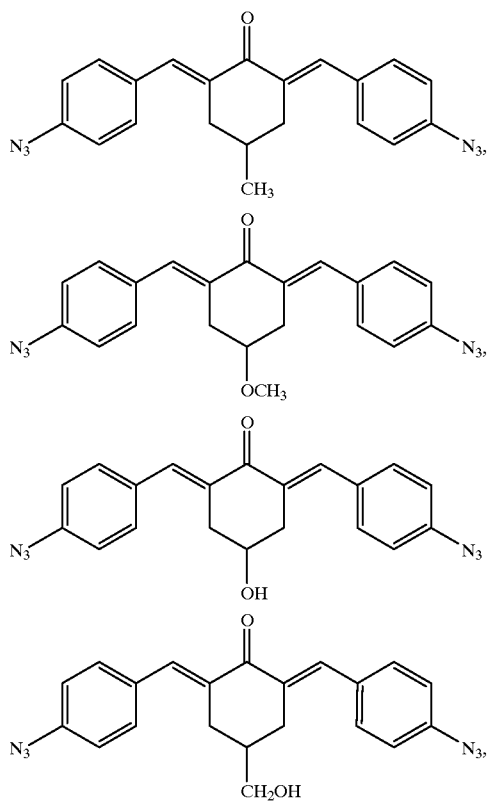

-continued

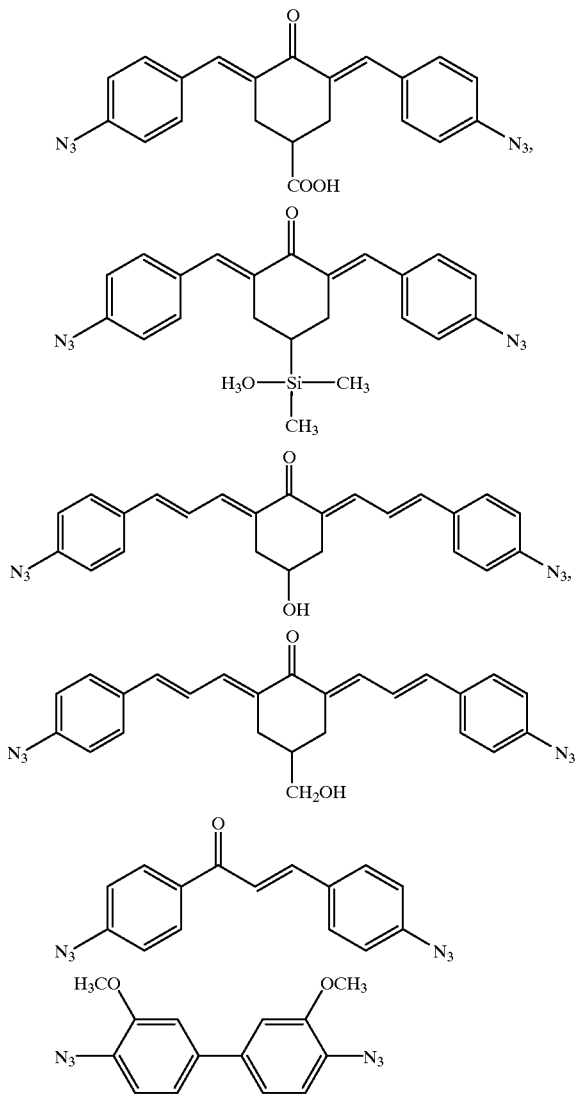

The amount of the photopolymerization initiator in the composition is preferably from 0.01 to 30 parts by weight, more preferably from 0.05 to 10 parts by weight, relative to 100 parts by weight of the polyimide precursor in the composition. If the amount is smaller than 0.01 parts by weight, the photosensitivity of the composition will be poor. However, if larger than 30 parts by weight, the mechanical properties of the polyimide films to be formed will be poor.

The negative-type photosensitive resin composition of the invention may contain an addition-polymerizable compound having a carbon-carbon unsaturated double bond. The addition-polymerizable compound includes, for example, diethylene glycol diacrylate, triethylene glycol diacrylate, tetyraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, 1,4-butanediol diacrylate, 1,6-hexanediol diacrylate, 1,4-butanediol dimethacrylate, 1,6-hexanediol methacrylate, pentaerythritol triacrylate, pentaerythritol tetraacrylate, pentaerythritol trimethacrylate, pentaerythritol tetramethacrylate, styrene, divinylbenzene, 4-vinyltoluene, 4-vinylpyridine, N-vinylpyrrolidone, 2-hydroxyethyl acrylate, 2-hydroxyethyl methacrylate, 1,3-acryloyloxy-2-hydroxypropane, 1,3-methacryloyloxy-2-hydroxypropane, methylenebisacrylamide, N,N-dimethylacrylamide, N-methylolacrylamide, etc. One or more of these groups may be used either singly or in combination.

The amount of the addition-polymerizable compound in the composition is preferably from 1 to 200 parts by weight relative to 100 parts by weight of the aromatic polyimide precursor in the composition. If the amount is smaller than 1 part by weight, the solubility of the composition in developer and/or the photosensitivity thereof will be poor. If, however, larger than 200 parts by weight, the mechanical properties of the polyimide films to be formed will be poor.

A radical polymerization inhibitor or retardant may be added to the negative-type photosensitive resin composition of the invention so as to enhance the storage stability of the composition.

The radical polymerization inhibitor or retardant includes, for example, p-methoxyphenol, diphenyl-p-benzoquinone, benzoquinone, hydroquinone, pyrogallol, phenothiazine, resorcinol, orthodinitrobenzene, paradinitrobenzene, metadinitrobenzene, phenanthraquinone, N-phenyl-1-naphtylamine, N-phenyl-2-naphthylamine, cupferron, phenothiazine, 2,5-toluquinone, tannic acid, parabenzylaminophenol, nitrosoamines, etc. One or more of these groups may be used either singly or in combination.

The amount of the radical polymerization inhibitor or retardant in the composition is preferably from 0.01 to 30 parts by weight, more preferably from 0.05 to 10 parts by weight, relative to 100 parts by weight of the aromatic polyimide precursor in the composition. If the amount is smaller than 0.01 parts by weight, the storage stability of the composition will be poor. If, however, larger than 30 parts by weight, the photosensitivity of the composition will be poor and, in addition, the mechanical properties of the polyimide films formed will also be poor.

On the other hand, in the positive-type photosensitive resin composition of the invention, the polyimide precursor generally has a group soluble in an aqueous basic solution, such as a carboxyl group or a phenolic hydroxyl group. Preferably, the composition contains a compound capable of generating an acid in response to light, along with the precursor. The compound capable of generating an acid in light is a photosensitive agent. When exposed to light, the compound generates an acid, and its function is to increase the solubility of the exposed area of the composition in developer (aqueous alkaline solution). The type of the compound is not limited, including, for example, o-quinonediazides, aryldiazonium salts, diaryliodonium salts, triarylsulfonium salts, etc. Of those, preferred are o-quinonediazides, as their sensitivity is high. Preferred o-quinonediazides may be prepared from o-quinonediazide sulfonylchlorides, hydroxy compounds, amino compounds and others, for example, by reacting them in the presence of a dehydrochlorination catalyst.

The amount of the optically acid-generating compound in the composition is preferably from 5 to 100 parts by weight, more preferably from 10 to 40 parts by weight, relative to 100 parts by weight of the polyimide precursor in the composition, from the viewpoint of the film thickness after development and of the sensitivity of the composition during development.

The photosensitive resin composition of the invention may be prepared by dissolving the above polyimide precursor and other components in a solvent to obtain a resulting solution.

The solvent may be an aprotic polar solvent, including, for example, N-methyl-2-pyrrolidone, N,N- dimethylformamide, N,N-dimethylacetamide, dimethylsulfoxide, hexamethylphosphoramide, tetramethylene sulfone, γ-butyrolactone, etc. The solvent may also be cyclohexanone, cyclopentanone, or the like. One or more of these solvents may be used either singly or in combination.

For the purpose of increasing the adhesiveness of the cured film of the composition to substrates, the composition may additionally contain any of organic silane compounds, aluminium chelate compounds, silicon-containing polyamic acids, etc.

The preferred organic silane compounds include, for example, γ-aminopropyltrimethoxysilane, γ-aminopropyltriethoxysilane, vinyltriethoxysilane, γ-glycidoxypropyltriethoxysilane, γ-methacryloxypropyltrimethoxysilane, triethoxysilylpropylethyl carbamate, N-(triethoxysilylpropyl) urea, etc. The aluminium chelate compounds include, for example, tris(acetylacetonato)aluminium, acetylacetatoaluminium diisopropylate, etc.

The photosensitive resin composition of the invention is applied onto substrates of silicon wafers, metal substrates, ceramic substrates and others, through dipping, spraying, screen printing, spin coating or the like, and dried under heat to remove the major part of the solvent, thereby giving a non-sticky film formed on the substrates. The thickness of the film formed is not specifically limited, but is preferably from 4 to 50 $\mu$m, more preferably from 6 to 40 $\mu$m, even more preferably from 10 to 40 $\mu$m, still more preferably from 20 to 35 $\mu$m, in view of the circuit characteristics, etc., of the devices comprising the film.

Since the photosensitive resin composition of the invention can form polyimide films having low residual stress, it is favorable to large-size wafers, such as silicon wafers having a diameter of 12 inches or larger.

The film of the composition is patternwise exposed to light or other electromagnetic radiation such as β- or γ-rays through a mask having a predetermined pattern, and thereafter the non-exposed area or the exposed area of the film (depending on whether negative or positive activity) is removed through development with a suitable developer, whereby a patterned film is obtained.

The photosensitive resin composition of the invention is favorable to i-line exposure with an i-line stepper or the like, but the invention is not limited to such. In addition to i-line exposure, the film of the composition of the invention is also processible with contact/proximity projectors using an ultra-high-pressure mercury lamp, mirror projectors, g-line steppers, as well as with any other projectors or sources of UV rays, visible rays, X-rays, electronic rays, etc.

The developer includes, for example, organic solvent developers comprising a good solvent (e.g., N,N-dimethylformamide, N,N-dimethylacetamide, N-methyl-2-pyrrolidone, etc.) or a mixed solvent composed of the good solvent and a poor solvent (e.g., lower alcohols, ketones, water, aromatic hydrocarbons, etc.), and alkali developers. Where the polyimide precursor in the composition is soluble in aqueous alkaline solutions, aqueous alkaline solutions can be used as the developer for the film of the composition. The aqueous alkaline solutions may be, for example, aqueous solutions containing any of sodium hydroxide, potassium hydroxide, sodium silicate, tetramethylammonium hydroxide or the like in an amount of at most 5% by weight, preferably from 1.5 to 3.0% by weight. More preferred developers are aqueous solutions containing tetramethylammonium hydroxide in an amount of from 1.5 to 3.0% by weight.

Surfactants and other additives may be added to the developers. The amount of each additive, if any, falls preferably between 0.01 and 10 parts by weight, more preferably between 0.1 and 5 parts by weight relative to 100 parts by weight of the developer.

After the development, the processed film is optionally but preferably rinsed with water or with a poor solvent, and then dried at about 100° C. or so, whereby the patterned film is stabilized. The patterned film is then heated to yield a low-stress relief pattern film having good heat resistance.

The heating temperature preferably falls between 150 and 500° C., more preferably between 200 and 400° C. If the heating temperature is lower than 150° C., the mechanical properties and the thermal characteristics of the film finally obtained will be poor. If higher than 500° C., the mechanical properties and the thermal characteristics of the film will also be poor due to thermal degradation and/or crosslinking.

The heating time preferably falls between 0.05 and 10 hours. If the heating time is shorter than 0.05 hours, the mechanical properties and the thermal characteristics of the film will be poor. If longer than 10 hours, the mechanical properties and the thermal characteristics of the film will also be poor.

The photosensitive resin composition of the invention may be used in electronic components such as semiconductor devices, multi-layered interconnection boards, etc. Specifically, the composition of the invention may be used for forming surface-protecting films and interlayer insulating films in semiconductor devices, or for forming interlayer insulating films in multi-layered interconnection boards, etc.

The electronic components of the invention are not specifically defined so far as they have surface-protecting films or interlayer insulating films made from the composition, and may have various structures.

One example of the process for fabricating the electronic components of the invention is mentioned below, in which a semiconductor device is fabricated as one example.

FIG. 1A to FIG. 1E show a process for fabricating a semiconductor device having a multi-layered interconnection structure. As illustrated, the semiconductor substrate 1, of, for example, Si, or the like, which has a circuit element is coated with a protective film 2, of, for example, silicon oxide or the like, except for the predetermined part of the circuit element, and a first conductor layer 3 is formed on the exposed circuit element. The semiconductor substrate is coated with a film 4, of, for example, a resin or the like that acts as an interlayer insulating film, according to a spin-coating method or the like (step of FIG. 1A).

Figure 1A:
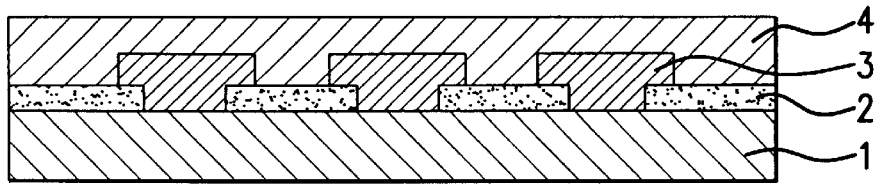
FIG. 1A to FIG. 1E show a process for fabricating a semiconductor device having a multi-layered interconnection structure.
Figure 1B:
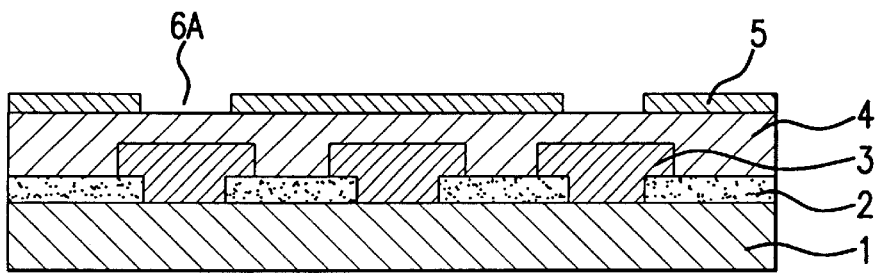
Figure 1C:
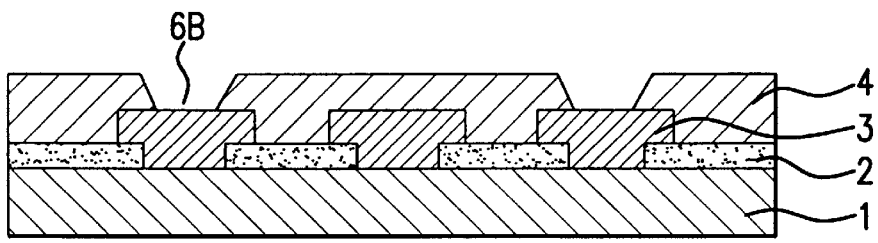

Next, phenol-novolak-based, or other equivalent photosensitive resin layer 5 is formed on the interlayer insulating film 4 according to a spin-coating method, and windows 6A are formed, through which a predetermined part of the interlayer insulating film 4 is exposed outside, according to a known photo-engraving technique (step of FIG. 1B).

The interlayer insulating film 4 below each window 6A is selectively etched according to a dry etching method using oxygen, carbon tetrafluoride or the like vapor, to give windows 6B. Next, the photosensitive resin layer 5 is completely removed with an etching solution capable of etching the photosensitive resin layer 5 only, but not etching the first conductor layer 3 exposed outside through the windows 6B (step of FIG. 1C).

Figure 1D:
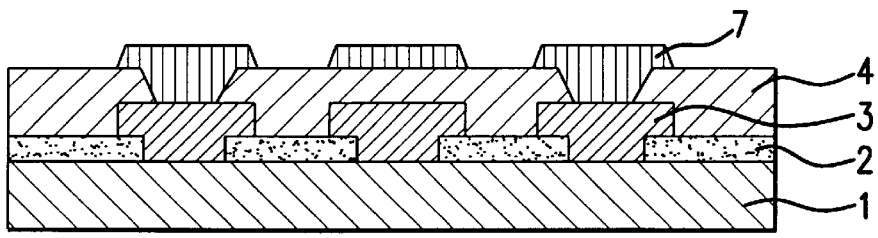

Next, according to a known photo-engraving technique, a second conductor layer 7 is formed, which is completely electrically connected with the first conductor layer 3 (step of FIG. 1D)

For forming a multi-layered interconnection structure having 3 or more layers, the steps illustrated are repeated for each layer.

Figure 1E:
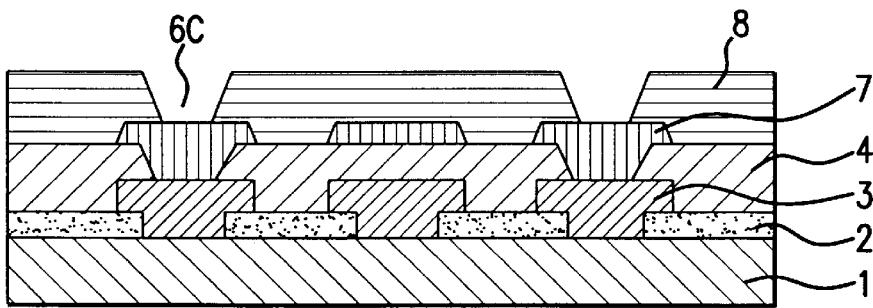

Next, a surface-protecting film 8 is formed (step of FIG. 1E). In the illustrated example, the surface-protecting film is formed according to a spin-coating method, in which the photosensitive resin composition of the invention is applied onto the wafer and dried thereon. Then, the film is exposed to light via a mask having a pattern for windows 6C formed in predetermined components. Thereafter, the exposed film is developed with an aqueous alkaline solution to give a predetermined pattern, and the pattern is then heated to produce a relief-patterned resin film. The resin film protects the conductor layer from external stress, α-rays, etc., and the semiconductor device thus fabricated has good reliability.

In the example illustrated, the interlayer insulating film may also be formed from the photosensitive resin composition of the invention.

The invention is described in more detail with reference to the following Examples, which, however, are not intended to restrict the scope of the invention.

PRODUCTION EXAMPLES 1 TO 3

A diamine component of m-tolidine and a solvent of N-methyl-2-pyrrolidone (NMP) were put into a 100-ml flask equipped with a stirrer and a thermometer, and dissolved with stirring at room temperature. To the resulting solution, was added the acid component shown in Table 1 below, and stirred for 24 hours to obtain a viscous solution of a polyimide precursor. The solution was heated at 70° C. until its viscosity amounted to 100 poise (solid content: 25% by weight). Thus were obtained solutions of polyimide precursor (PAA-1 to PAA-3). The amounts of the diamine component, the acid component and NMP used, and the molecular weight of the polyimide precursors obtained are all shown in Table 1.

PRODUCTION EXAMPLE 4

The acid component shown in Table 1, a half part of a solvent of N,N-dimethylacetamide (DMAc), and 2 equivalents of 2-hydroxyethyl methacrylate were put into a 100-ml flask equipped with a stirrer and a thermometer. With stirring at room temperature, 2.2 equivalents of pyridine was added. The mixture was further stirred at 60 to 70° C. for 1 hour, then cooled to room temperature, and stirred overnight. The mixture was then cooled to 0° C., and 2.6 equivalents of thionyl chloride was then dropwise added thereto with stirring. After returning to room temperature, the mixture was stirred for 2 hours to give an acid chloride solution. Apart from this, a diamine component of m-tolidine, the remaining part of DMAc and 2 equivalents of pyridine were put into a 100-ml flask equipped with a stirrer and a thermometer, dissolved with stirring at room temperature, and then cooled to 0° C. While stirring the resulting mixture, the acid chloride solution prepared previously was dropwise added, and the resultant mixture further stirred at room temperature for 1 hour to obtain a solution of a polyimide precursor. This precursor was reprecipitated in ion-exchanged water, and the resulting solid was washed with water and then dried in vacuum to obtain a polyimide precursor (PAA-4). The amount of the diamine component, the acid component and DMAc used, and the molecular weight of the polyimide precursor obtained are shown in Table 1.

TABLE 1

| | Acid Component (amount used) | Diamine Component (amount used) | Solvent (amount used) | Polyimide Precursor | Weight-Average Molecular Weight |
|---|---|---|---|---|---|
| Production Example 1 | [structure with $F_3C$, $CF_3$]<br>11.46 g (25 mmols) | 5.31 g (25 mmols) | NMP 50.29 g | PAA-1 | 108000 |
| Production Example 2 | [structure with $H_3C$, $CF_3$]<br>10.11 g (25 mmols) | 5.31 g (25 mmols) | NMP 46.25 g | PAA-2 | 113000 |
| Production Example 3 | [structure with $H_3C$, $CH_3$, Si]<br>9.16 g (25 mmols) | 5.31 g (25 mmols) | NMP 43.40 g | PAA-3 | 74000 |

TABLE 1-continued

| | Acid Component (amount used) | Diamine Component (amount used) | Solvent (amount used) | Polyimide Precursor | Weight-Average Molecular Weight |
|---|---|---|---|---|---|
| Production Example 4 | [structure] 10.11 g (25 mmols) | 5.31 g (25 mmols) | DMAc 70 g | PAA-4 | 41000 |

EXAMPLES 1 TO 3

To 10 g of each polyimide precursor solution (any of PAA-1 to PAA-3) prepared in Production Examples 1 to 3 was added 0.027 g of 2,6-bis(4'-azidobenzal)-4-carboxycyclohexanone (CA), 0.027 g of 4,4'-bis(diethylamino)benzophenone (EBA) and 0.054 g of 1-phenyl-2-(o-ethoxycarbonyl)oximinopropan-1-one (PDO). To this was further added dimethylaminopropyl methacrylate (MDAP), the amount of MDAP added being the same equivalent amount as the carboxyl equivalent of the polyimide precursor. Mixing with stirring gave uniform solutions of photosensitive resin compositions of Examples 1 to 3.

EXAMPLE 4

An amount of 2.50 g of the polyimide precursor (PAA-4) that had been prepared in Production Example 4 was dissolved in 5.83 g of γ-butyrolactone, to which were added 0.027 g of 2,6-bis(4'-azidobenzal)-4-carboxycyclohexanone (CA), 0.027 g of 4,4'bis(diethylamino)benzophenone (EBA) and 0.054 g of 1-phenyl-2-(o-ethoxycarbonyl) oximinopropan-1-one (PDO). Mixing with stirring gave a uniform solution of a photosensitive resin composition of Example 4.

The photosensitive resin composition solutions prepared as above were separately filtered. Each was dropwise applied onto a silicon wafer by spin-coating, and then heated and dried on a hot plate at 100° C. for 150 seconds to form a 15 μm film on the wafer. Using an i-line stepper, the film was exposed via a pattern mask. This was heated at 100° C. for 60 seconds, and then developed with a mixture of N-methyl-2-pyrrolidone/water (75/25 by weight), using a paddle. Further heating it at 100° C. for 30 minutes, at 200° C. for 30 minutes and at 350° C. for 60 minutes gave a polyimide resin pattern.

The transmittance of the polyimide precursors (PAA-1 to PAA-4) prepared in Production Examples 1 to 4, the thermal expansion coefficient of the polyimide films from the precursors, the residual stress of the polyimide films on silicon wafers, and the resolution of the polyimide relief patterns were measured and evaluated according to the methods mentioned below. The data are in Table 2.

The transmittance was measured as follows: A resin solution of each polyimide precursor (PAA-1 to PAA-4) was applied onto a substrate through spin-coating, and dried at 85° C. for 3 minutes and then at 105° C. for 3 minutes. The transmittance of the resulting film (thickness: 10 μm) was measured with a spectrophotometer. The thermal expansion coefficient was measured as follows: The polyimide film having a thickness of 10 μm, formed by applying a resin solution of each polyimide precursor (PAA-1 to PAA-4) onto a substrate followed by drying it under heat, was heated at a heating rate of 10° C./min under a load of 10 g, and its thermal expansion coefficient was measured with TMA. The residual stress was measured as follows: On a 6-inch silicon wafer, formed was a polyimide film from each precursor, and its residual stress was measured at 25° C. with a film stress meter (Tencor's FLX-2320 Model).

In order to measure the resolution of the photosensitive resin compositions, through-hole patterns were formed from each composition. The smallest size of the developable through-holes formed indicates the resolution of the resin composition tested.

TABLE 2

| | Polyimide Precursor | i-line Transmittance of Precursor (%) | Residual Stress of Polyimide Film (MPa) | Resolution μm |
|---|---|---|---|---|
| Example 1 | PAA-1 | 41 | 8 | 5 μm |
| Example 2 | PAA-2 | 53 | 5 | 5 μm |
| Example 3 | PAA-3 | 51 | 12 | 6 μm |
| Example 4 | PAA-4 | 12 | 14 | 6 μm |

PRODUCTION EXAMPLES 5 AND 6, PRODUCTION EXAMPLES 9 AND 10

(1) Preparation of Acid Chloride Solution:

An amount of 0.03 mols of the acid anhydride shown in Table 3 below, 7.81 g (0.06 mols) of 2-hydroxyethyl methacrylate (HEMA), 4.75 g (0.06 mols) of pyridine, 0.01 g of hydroquinone, and 70 ml of N,N'-dimethylacetamide (DMAc) were put into a 200-ml four-neck flask, and stirred at 60° C. for 2 hours to give a transparent solution. This solution was further stirred at room temperature for 7 hours. Next, while cooling the flask with ice, 8.57 g (0.072 mols) of thionyl chloride was dropwise added over a period of 10 minutes. This mixture was further stirred for 1 hour at room temperature to obtain a solution containing an acid chloride.

(2) Production of Polyimide Precursor:

0.03 mols of the diamine shown in Table 3, 5.06 g (0.064 mols) of pyridine, 0.01 g of hydroquinone and 50 ml of DMAc were put into another 200-ml four-neck flask. While the mixture in the flask was cooled on ice (to be at a temperature not higher than 10° C.) and stirred, the acid chloride solution prepared in (1) was gradually and dropwise added thereto over a period of 1 hour. Then, this mixture was further stirred at room temperature for 1 hour, and poured into one liter of water. The polymer thus precipitated was taken out through filtration, washed twice, and dried in a vacuum. The resulting polymer powder was dissolved in γ-butyrolactone (γ-BL) to have a controlled viscosity of 80 poise. Thus were prepared solutions of polyimide precursors (PAE-1, 2, PAE-5, 6).

PRODUCTION EXAMPLES 7 AND 8

(1) Preparation of Acid Chloride Solution:

An amount of 0.03 mols of the acid anhydride shown in Table 3, 0.06 mols of n-butyl alcohol, 4.75 g (0.06 mols) of pyridine, and 70 ml of N,N'-dimethylacetamide (DMAc) were put into a 200-ml four-neck flask, and stirred at 60° C. for 2 hours to give a transparent solution. This was further stirred at room temperature for 7 hours. Next, with the flask being cooled with ice, 8.57 g (0.072 mols) of thionyl chloride was dropwise added thereto over a period of 10 minutes. This was still further stirred for 1 hour at room temperature to obtain a solution containing an acid chloride.

(2) Production of Polyimide Precursor:

An amount of 0.03 mols of the diamine shown in Table 3, 5.06 g (0.064 mols) of pyridine, and 50 ml of DMAc were put into another 200-ml four-neck flask. While the mixture in the flask was cooled on ice (to be at a temperature not higher than 10° C.) and stirred, the acid chloride solution prepared in (1) was gradually and dropwise added thereto over a period of 1 hour. Then, this mixture was further stirred at room temperature for 1 hour, and then poured into one liter of water. The polymer thus precipitated was taken out through filtration, washed twice, and dried in a vacuum.

The resulting polymer powder was dissolved in γ-butyrolactone (γ-BL) to have a controlled viscosity of 80 poise. Thus were prepared solutions of polyimide precursors (PAE-3, 4).

The viscosity was measured with an E-type viscometer (EHD Model from Tohki Industries), for which the temperature was 25° C. and the revolution was 2.5 rpm.

The polyimide precursor solutions (PAE-1 to PAE-6) were dried, and subjected to KBr-IR spectrometry (with JIR-100 Model from JEOL). In all their IR spectra were seen C=O absorption for amido groups at around 1600 cm$^{-1}$ and N—H absorption at around 3300 cm$^{-1}$.

EXAMPLES 5 AND 6, COMPARATIVE EXAMPLES 1 AND 2

10 g of each polyimide precursor (PAE-1, 2, 5, 6) prepared in Production Examples 5, 6, 9 and 10 was dissolved in 15 g of γ-butyrolactone (γ-BL), to which were added 100 mg of Michler's ketone and 200 mg of 1,3-diphenyl-1,2,3-propanetrione-2-(o-ethoxycarbonyl)oxime and dissolved to obtain uniform solutions of negative-type photosensitive resin compositions of Examples 5 and 6 and Comparative Examples 1 and 2.

EXAMPLES 7 AND 8

30 g of each polyimide precursor prepared in Production Examples 7 and 8 was dissolved in 54 g of NMP with stirring, to which was added 0.9 g of 3-isocyanatopropyltriethoxysilane, and further stirred for 12 hours. Next, 7.50 g of a product as prepared by reacting 2,3,4,4'-tetrahydroxybenzophenone and naphthoquinone-1,2-diazido-5-sulfonyl chloride in a ratio of 1/3 by mol was added thereto and dissolved to obtain solutions of positive-type photosensitive resin compositions of Examples 7 and 8.

The photosensitive resin composition solutions prepared as above were separately filtered. Each was dropwise applied onto a silicon wafer through spin-coating.

Next, this mixture was heated on a hot plate at 100° C. for 150 seconds to form a 15 μm film on the wafer. Using an i-line stepper, the film was exposed via a pattern mask (negative mask or positive mask).

After having been thus exposed, this mixture was developed with an aqueous solution of tetramethylammonium hydroxide, using a paddle. Further heating it at 3500C for 60 minutes gave a polyimide resin pattern.

A part of the polyimide relief pattern was subjected to KBr-IR spectrometry, which gave a specific imido absorption at around 1780 cm$^{-1}$.

The light transmittance of the polyimide precursors PAE-1 to PAE-6) prepared in Production Examples 5 to 10, the residual stress of the polyimide films on silicon wafers, and the resolution of the polyimide relief patterns were measured and evaluated according to the methods mentioned below. The data are in Table 4.

The transmittance was measured as follows: A resin solution of each polyimide precursor (PAE-1 to PAE-6) was applied onto a substrate by spin-coating, and dried at 85° C. for 2 minutes and then at 105° C. for 2 minutes. The transmittance of the resulting film (thickness: 20 μm) was measured with a spectrophotometer.

The residual stress was measured as follows: On a 5-inch silicon wafer, formed was a polyimide film from each precursor, and its residual stress was measured with a film stress meter (Tencor's FLX-2320 Model).

In order to measure the resolution of the photosensitive resin compositions, through-hole test patterns were formed from each composition. The smallest size of the developable through-holes formed indicates the resolution of the resin composition tested.

The relief patterns formed in Examples 5 to 8 and Comparative Examples 1 and 2 were heated in a nitrogen atmosphere at 350° C. for 60 minutes to obtain polyimide patterns. The polyimide patterns from the relief patterns of Examples 5 to 8 had a good trapezoidal profile in cross section, as well as reflecting the good rectangular profile of the original relief patterns with high resolution. However, the polyimide patterns from the relief patterns of Comparative Examples 1 and 2 had an unfavorable, reversed-trapezoidal profile in cross section, reflecting the unfavorable reversed-trapezoidal profile of the original relief patterns with low resolution.

TABLE 3

| | Acid Component | Diamine Component | Polyimide Precursor | Weight-Average Molecular Weight (Mw) |
| --- | --- | --- | --- | --- |
| Production Example 5 | MTXDA | DDE-A | PAE-1 | 41000 |
| Production Example 6 | SIXDA | DDE-A | PAE-2 | 33000 |
| Production Example 7 | MMXDA | 2,2-HAB | PAE-3 | 27000 |
| Production Example 8 | 6FCDA | 3,3-HAB | PAE-4 | 30000 |
| Production Example 9 | s-BPDA | DDE-A | PAE-5 | 36000 |
| Production Example 10 | PMDA | DDE-A | PAE-6 | 32000 |

MTXDA:

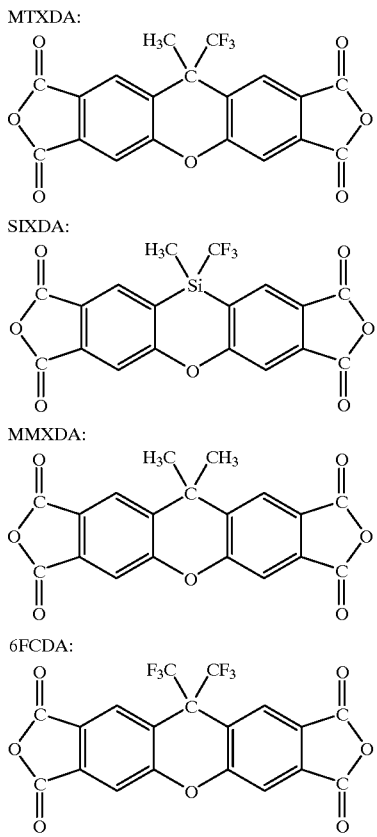

s-BPDA: biphenyltetracarboxylic acid anhydride
PMDA: pyromellitic acid anhydride
DDE-A:

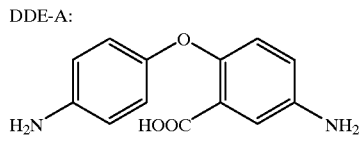

2,2-HAB:

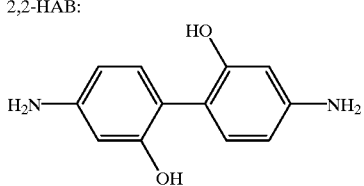

3,3-HAB:

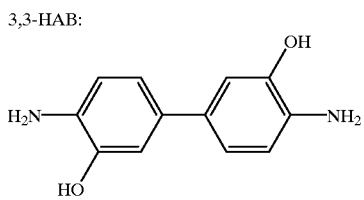

TABLE 4

| | i-line Transmittance of Precursor (%) | Residual Stress (MPa) | Resolution (μm) |
|---|---|---|---|
| Example 5 | 50 | 20 | 5 |
| Example 6 | 35 | 18 | 5 |
| Example 7 | 20 | 12 | 5 |
| Example 8 | 15 | 15 | 5 |

TABLE 4-continued

| | i-line Transmittance of Precursor (%) | Residual Stress (MPa) | Resolution (μm) |
|---|---|---|---|
| Comparative Example 1 | 20 | 35 | 20 |
| Comparative Example 2 | 0.1 | 20 | 20 |

Providing the excellent photosensitive resin composition as above, the invention has solved the problems which no one in the art could heretofore solve. Specifically, the aromatic polyimide precursor in the composition of the invention has high i-line transmittance, and the polyimide resin derived from it through imidization has low stress. In addition, the precursor films have the advantages of good heat resistance, high sensitivity and high resolution.

The photosensitive resin compositions of the invention are developable with an aqueous alkaline solution not having any adverse influence on the environment.

According to the patterning method of the invention using the polyimide precursor composition with high i-line transmittance and high sensitivity, films of the composition can be patterned through i-line exposure to give high-resolution patterns having a good profile. After imidization, the patterned polyimide films have high heat resistance and low stress. In the patterning method of the invention, the films of the composition can be developed with an aqueous alkaline solution having minimal adverse influence on the environment.

The electronic components of the invention have high-resolution relief patterns of polyimide films with good heat resistance, in which the patterns formed have a good profile, little residual stress, and, therefore, high reliability.

While the invention has been described in detail and with reference to specific embodiments thereof, it will be apparent to one skilled in the art that various changes and modifications can be made therein without departing from the spirit and scope thereof. The scope of the invention is defined by the appended claims.

What is claimed is:

1. A photosensitive resin composition comprising:
an aromatic polyimide precursor including structural units of a general formula (I):

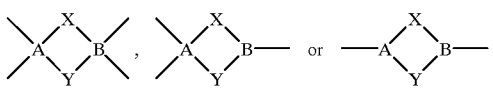

wherein A and B each independently represent a trivalent or tetravalent aromatic group;
wherein X and Y each independently represent a divalent group not conjugating with A or B;
wherein said resin composition is selected from the group consisting of (1) negative photosensitive compositions, wherein a portion of said polyimide film exposed to light portion is cross-linkable or polymerizable followed by curing, and an unexposed portion of said polyimde film is removable by a developer to reveal a pattern of the exposed portion, and (2) positive photosensitive compositions, wherein a portion of said polyimide film exposed to light is made more soluble and removable by a developer, leaving a pattern of an unexposed portion;

wherein said negative photosensitive resin composition further comprises a photo-polymerization initiator, and a carbon-carbon unsaturated double bond in said polyimide precursor or a compound added to the composition; and wherein said positive photosensitive resin composition further comprises a compound capable of generating an acid upon exposure to light; and wherein said polyimide precursor of said positive photosensitive resin composition has a group selected from a carboxylic acid or a phenolic hydroxyl group.

2. The photosensitive resin composition as claimed in claim 1, wherein said aromatic polyimide precursor having the structure of formula (I) has structural units of a general formula (II):

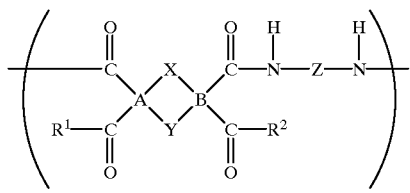

(II)

wherein A and B each independently represent a tetravalent aromatic group;

wherein X and Y each independently represent a divalent group not conjugating with A or B; Z represents a divalent aromatic group; and wherein $R^1$ and $R^2$ each independently represent a hydroxyl group or a monovalent organic group.

3. The photosensitive resin composition as claimed in claim 2, wherein either $R^1$ or $R^2$ in formula (II) is a monovalent organic group having a photosensitive group.

4. The photosensitive resin composition as claimed in claim 2, wherein either $R^1$ or $R^2$ in formula (II) is a group of:

—$O^{31}$ $N^+HR^4R^5$—$R^6$,

—O—$R^6$, or

—NH—$R^6$ wherein $R^4$ and $R^5$ each independently represent a hydrocarbon group; and wherein $R^6$ represents a monovalent organic group.

5. The photosensitive resin composition as claimed in claim 4, wherein $R^6$ is a group having a carbon-carbon unsaturated double bond.

6. The photosensitive resin composition as claimed in claim 4, wherein $R^1$ or $R^2$ in formula (II) is a group of:

—$O^{31}$ $N^+HR^4R^5$—$R^6$ wherein $R^4$ and $R^5$ each independently represent a hydrocarbon group; and wherein $R^6$ represents a monovalent organic group having a carbon-carbon unsaturated double bond.

7. The photosensitive resin composition as claimed in claim 4, wherein $R^1$ or $R^2$ in formula (II) is a group of:

—O—$R^6$ wherein $R^6$ represents a monovalent organic group.

8. The photosensitive resin composition as claimed in claim 7, wherein Z in formula (II) is a group having a carboxyl group or a phenolic hydroxyl group.

9. The photosensitive resin composition as claimed in claim 7, wherein Z in formula (II) is a group of a general formula (III):

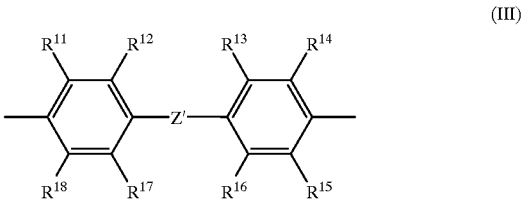

(III)

wherein Z' represents a single bond, O, $CH_2$, S or $SO_2$; and wherein $R^{11}$ to $R^{18}$ each independently represent H, COOH, OH, an alkyl group having from 1 to 10 carbon atoms, a fluoroalkyl group having from 1 to 10 carbon atoms, a fluoroalkoxy having from 1 to 10 carbon atoms or a halogen atom, and, optionally, at least one of $R^{11}$ to $R^{18}$ is COOH or OH.

10. The photosensitive resin composition as claimed in claim 2, wherein X and Y each independently represent a carbonyl group, an oxy group, a thio group, a sulfoxyl group, a sulfonyl group, an optionally-substituted alkylene group having from 1 to 5 carbon atoms, an optionally-substituted imino group, an optionally-substituted silylene group, or a combination of any of these groups.

11. The photosensitive resin composition as claimed in claim 1, wherein the aromatic polyimide precursor is soluble in an aqueous alkaline solution.

12. The photosensitive resin composition as claimed in claim 1, wherein X and Y each independently represent a carbonyl group, an oxy group, a thio group, a sulfoxyl group, a sulfonyl group, an optionally-substituted alkylene group having from 1 to 5 carbon atoms, an optionally-substituted imino group, an optionally-substituted silylene group, or a combination of any of these groups.

13. The photosensitive resin composition as claimed in claim 12, wherein X and Y each independently represent an oxy group, a thio group, a sulfonyl group, an optionally-substituted methylene group, or an optionally-substituted silylene group.

14. The photosensitive resin composition as claimed in claim 13, wherein X is an optionally-substituted methylene group, and Y is an oxy group.

15. The photosensitive resin composition as claimed in claim 1, wherein A and B are both benzene rings.

16. A photosensitive resin composition, comprising:

an aromatic polyimide precursor;

wherein a 10 μm thick polyimide film made from said resin composition by imidation ring closure and deposited on a silicon substrate has a light transmittance at a wavelength of 365 nm of at least 1% and a residual stress of at most 25 MPa;

wherein said aromatic polyimide precursor includes repetitive units of a general formula (I):

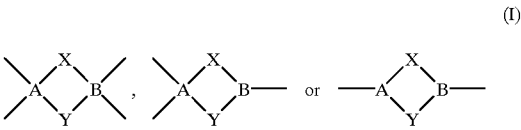

(I)

wherein A and B each independently represent a trivalent or tetravalent aromatic group; and wherein X and Y each independently represent a divalent group not conjugating with A or B.

17. A method for forming patterns, which comprises:
applying a photosensitive resin composition onto a substrates;
drying the composition;
exposing the composition;
developing the composition;
heating the composition;
wherein said photosensitive resin composition comprises an aromatic polyimide precursor having structural units of a general formula (I);

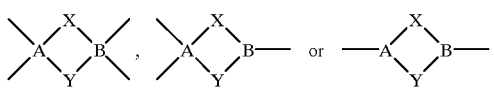
(I)

wherein A and B each independently represent a trivalent or tetravalent aromatic group;
wherein X and Y each independently represent a divalent group not conjugating with A or B;
wherein said resin composition is selected from the group consisting of (1) negative photosensitive compositions, wherein a portion of said polyimide film exposed to light portion is cross-linkable or polymerizable followed by curing, and an unexposed portion of said polyimde film is removable by a developer to reveal a pattern of the exposed portion, and (2) positive photosensitive compositions, wherein a portion of said polyimide film exposed to light is made more soluble and removable by a developer, leaving a pattern of an unexposed portion;
wherein said negative photosensitive composition further comprises a photopolymerization initiator, and a carbon-carbon unsaturated double bond in said polyimide precursor or a compound added to the composition; and
wherein said positive photosensitive composition further comprises a compound capable of generating an acid upon exposure to light; and wherein said polyimide precursor of said positive photosensitive resin composition has a group selected from a carboxylic acid or a phenolic hydroxyl group.

18. The patterning method as claimed in claim 17, wherein i-lines are used as a light source in the exposing step.

19. The patterning method as claimed in claim 18, wherein the substrate is a silicon wafer having a diameter of at least 12 inches.

20. An electronic component having a layer patterned according to the method of claim 17.

21. The electronic component as claimed in claim 20, wherein the component is a semiconductor device and the patterned layer is a surface-protecting film.

22. The electronic component as claimed in claim 20, wherein the patterned layer is an interlayer insulating film.

* * * * *